United States Patent [19]

Saari

[11] Patent Number: 4,638,259
[45] Date of Patent: Jan. 20, 1987

[54] CMOS DIFFERENTIAL AMPLIFIER STAGE WITH BULK ISOLATION

[75] Inventor: Veikko R. Saari, Spring Lake Heights, N.J.

[73] Assignee: AT&T Bell Laboratories, Murray Hill, N.J.

[21] Appl. No.: 814,199

[22] Filed: Dec. 27, 1985

[51] Int. Cl.[4] .............................................. H03F 3/45
[52] U.S. Cl. .................................... 330/253; 330/258
[58] Field of Search ................ 330/253, 258, 277, 307

[56] References Cited

U.S. PATENT DOCUMENTS 3,961,279  6/1976  Davis .................................. 330/253

OTHER PUBLICATIONS

1983 *IEEE International Solid-State Circuits Conference*, "Session XVII, Precision Analog Components" T. C. Choi, R. T. Kaneshiro, R. Brodersen, P. Gray, W. Jett and M. Wilcox: ISSCC 83/Friday, 2/25/83, Imperial Ballroom B/11:15 a.m., pp. 246, 247 and 314.
*IEEE Journal of Solid-State Circuits*, "High-Frequency CMOS Switched-Capacitor Filters for Communications Application" T. Choi, R. T. Kaneshiro, R. W. Brodersen, P. R. Gray, W. Jett and M. Wilcox, vol. sc-18, No. 6, Dec. 1983.

*Primary Examiner*—James B. Mullins
*Attorney, Agent, or Firm*—Volker R. Ulbrich

[57] ABSTRACT

An MOS differential input stage circuit (10) includes first (M1) and second (M2) differential input transistors with input nodes at their gates and output nodes at their drains. The sources are connected to a first current source (24). A second pair of differential transistors (M3,M4) which have their sources connected to a second current source (28), their drains connected to a reference voltage node, and their gates common to the respective first differential input transistors, have their bulk regions in common with the bulk regions (20) of the first differential transistors for isolation from supply voltage noise and from common mode input signal effects.

6 Claims, 2 Drawing Figures

CMOS DIFFERENTIAL AMPLIFIER STAGE WITH BULK ISOLATION

TECHNICAL FIELD

The present invention relates to electronic amplifiers of the type which act on a differential input and which use field effect transistors.

BACKGROUND OF THE INVENTION

Differential input amplifiers are widely used as stages in various types of electronic circuits, particularly at higher frequencies, where signal distortions are increasingly evident. For circuits implemented in complementary metal-oxide-silicon (CMOS) technology, a typical differential input stage is formed with two transistors having common sources connected to a current source. The control electrodes, or gates of the devices form inverting and noninverting input nodes, respectively, while the drains form inverting and noninverting output nodes, respectively. The output nodes usually provide a pair of signals to a second, differential amplifier stage. At frequencies above the audible range, CMOS differential input stages suffer significantly from common mode transmission and power supply noise coupling.

SUMMARY OF THE INVENTION

In accordance with the present invention, a CMOS differential amplifier input circuit having a primary differential pair of transistors with their conducting paths connected at one side to a first current source is provided with a secondary differential pair of transistors connected in parallel between a second current source and a reference potential. The bulk regions of the primary and secondary differential transistors are all connected together and to the sources of the secondary differential transistors. With this arrangement, the common mode rejection of the differential amplifier stage is improved in that charging of the bulk regions of the primary differential transistors is not supplied through a lead which is also connected to their signal conduction path. This provides effective isolation of the primary outputs from the common-mode-driven bulk-charging current. Where the primary input differential transistor pair is formed in a tub of P (or N) material sitting on a substrate of N (or P) material, as is typically the case, this arrangement is further advantageous in that it reduces the coupling of power supply noise through the tub-to-substrate capacitance to the signal path.

DETAILED DESCRIPTION

In the descriptions of the examples below, all the transistors are N-conductivity type conduction channel enhancement mode MOS devices. The connections of a transistor as such refers to the connections of its conduction channel, namely the source-drain. Ground potential may be any suitable reference potential, and is not necessarily actual earth ground potential or a chassis potential.

Figure 1:
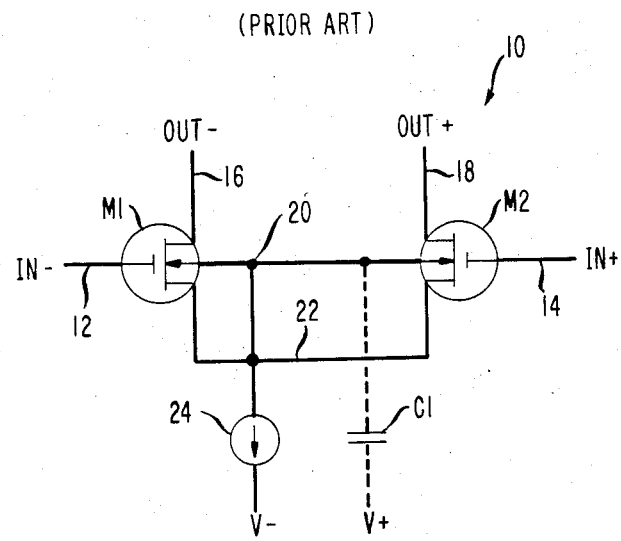
FIG. 1 is a schematic circuit diagram of a prior art differential input circuit.

The differential input circuit 10 of FIG. 1 is representative of prior art structures. It includes a pair of first and second differential input transistors M1,M2 with gates 12, 14 and drains 16,18, respectively. Their sources are connected together as a source node 22. The source node 22, in turn, is connected to a current source 24 which provides bias current to the transistors M1,M2. The bulk regions of the transistors M1,M2 are connected together as a bulk node 20 and also connected to the source node 22. A capacitor C1, shown in phantom connected between the bulk node 20 and a positive supply voltage V+, represents parasitic capacitance which is present in the transistors M1 and M2.

The circuit 10 is subject to significant common mode transmission at relatively high signal frequencies. Such transmission can be attributed to the effects of charging of the bulk regions of the transistors M1 and M2 in response to the common mode voltage on the gates 12,14. The charging current is drawn from the source node 22 and thereby becomes coupled to the signal path of the transistors M1,M2. The circuit 10 is also subject to noise coupling from the positive supply voltage node V+ via the parasitic capacitance C1. This coupling is particularly troublesome at above-audio signal frequencies.

Figure 2:
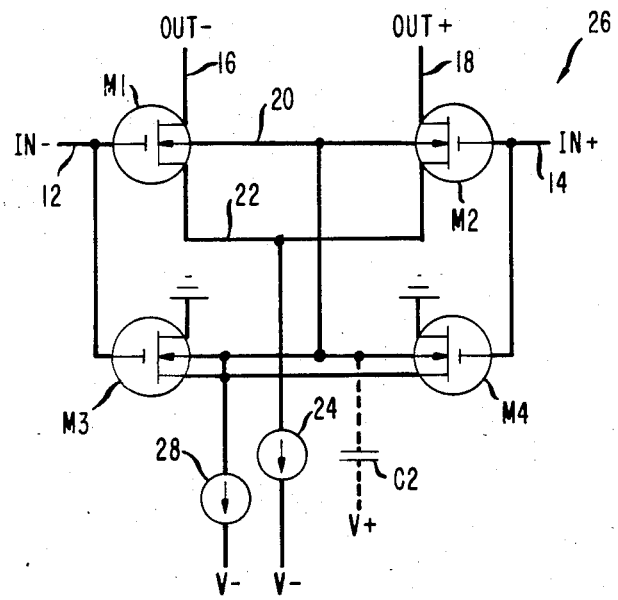
FIG. 2 is a schematic circuit diagram of a differential input circuit in accordance with the preferred embodiment of the present invention.

The circuit 26 of FIG. 2 is one example of a differential input stage in accordance with the present invention. Elements of the circuit 26 which correspond to similar elements in the circuit 10 of FIG. 1 are denoted with similar reference symbols. A pair of secondary differential isolation transistors M3 and M4 are connected to have common gates with the primary differential input transistors M1 and M2, respectively. The bulk regions of all four transistors M1,M2,M3,M4 are connected together and are parasitically coupled to the positive supply voltage V+ through the capacitance C2, shown in phantom. The sources of the secondary transistors M3,M4 are connected to their bulk and to a second current source 28, while the drains are connected to ground potential.

With the circuit 26, common mode transmission is reduced, since the charging current for the bulk regions of the primary transistors M1,M2 is not associated with a signal path and is instead supplied from the sources of the secondary transistors M3,M4. The bias current of, and the area occupied by the secondary differential transistors M3,M4 do not have to be as great as those of the primary differential transistors M1,M2. The secondary transistors M3,M4 are designed with only half the length-to-width ratio of the primary transistors M1,M2, and the secondary bias current source 28 is smaller than the primary current source 24. The appropriate relative proportions of these devices are determined for the particular application for which the circuit 26 is to be used.

While the circuit 26 described above is implemented with N-type conduction channel devices, it will be readily apparent to those skilled in the art that analogous arrangements also fully within the scope of the invention may be readily designed with P-type conduction channel devices, or with depletion mode devices of either conduction channel conductivity type.

What is claimed is:

1. In a differential amplifier of the type having:
   first and second field-effect transistors having one side of their conduction paths connected to a first current source, the control electrodes of the first and second transistors being first and second input nodes, respectively, and the other side of the conduction paths of the first and second transistors being first and second output nodes, respectively, The improvement therein comprising:

third and fourth field-effect transistors having one side of their conduction paths connected to the bulk regions of the first, second, third and fourth transistors and to a second current source, the control electrodes of the third and fourth transistors being connected, respectively, to the control electrodes of the first and second transistors, and the other side of the conduction path of the third and fourth transistors being connected to a common reference voltage.

2. The amplifier defined in claim 1 wherein the first and second transistors have the same conduction channel conductivity type.

3. The amplifier defined in claim 2 wherein the third and fourth transistors have the same conduction channel conductivity type.

4. The amplifier defined in claim 3 wherein the first and second transistors have substantially identical operating characteristics.

5. The amplifier defined in claim 4 wherein the third and fourth transistors have substantially identical operating characteristics.

6. The amplifier defined in claim 5 wherein the first, second, third, and fourth transistors are of the enhancement mode type with N-conductivity type conduction channels.

* * * * *